United States Patent
Chen

(10) Patent No.: US 7,456,775 B2
(45) Date of Patent: Nov. 25, 2008

(54) PIPELINE ANALOG-TO-DIGITAL CONVERTER CAPABLE OF SHARING COMPARATORS

(75) Inventor: Cheng-Jui Chen, Tao-Yuan Hsien (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 11/620,055

(22) Filed: Jan. 5, 2007

(65) Prior Publication Data
US 2007/0159374 A1 Jul. 12, 2007

(30) Foreign Application Priority Data
Jan. 6, 2006 (TW) .............................. 95100669 A

(51) Int. Cl.
*H03M 1/38* (2006.01)
(52) U.S. Cl. ....................................... 341/161; 341/156
(58) Field of Classification Search ................. 341/156, 341/161, 162, 163
See application file for complete search history.

(56) References Cited

U.S. PATENT DOCUMENTS

| | | | |
|---|---|---|---|
| 5,499,027 A | 3/1996 | Karnanicolas et al. | |
| 6,211,805 B1 | 4/2001 | Yu | |
| 6,285,309 B1 | 9/2001 | Yu | |
| 6,313,780 B1 * | 11/2001 | Hughes et al. | ............... 341/156 |
| 6,369,744 B1 | 4/2002 | Chuang | |
| 6,714,152 B1 | 3/2004 | Chou | |
| 2005/0225461 A1 | 10/2005 | Tsai et al. | |
| 2005/0225462 A1 | 10/2005 | Tsai et al. | |
| 2005/0225470 A1 | 10/2005 | Tsai et al. | |

FOREIGN PATENT DOCUMENTS

| | | |
|---|---|---|
| TW | 494641 | 7/2002 |
| TW | 564599 | 12/2003 |
| TW | 595109 | 6/2004 |

OTHER PUBLICATIONS

Chiu, Y. et al., A 14-b 12-MS/s CMOS Pipeline ADC With Over 100-dB SFDR, IEEE Journal of Solid-State Circuits, vol. 39, No. 12, Dec. 2004 pp. 2139-2151.*

* cited by examiner

*Primary Examiner*—Howard Williams
(74) *Attorney, Agent, or Firm*—Winston Hsu

(57) ABSTRACT

A pipeline analog-to-digital converter including: a first conversion module, a second conversion module, at least a comparator, a first switch module and a second switch module. The first conversion module includes a first storage unit and a first multiplying digital-to-analog converter (MDAC). An input end of the second conversion module is coupled in series with an output end of the first conversion module. The second conversion module includes a second storage unit and a second MDAC. The first switch module is utilized for coupling the input end of the first conversion module or the second conversion module to an input end of the comparator; and the second switch module is utilized for coupling an output end of the comparator to the first or the second storage unit.

21 Claims, 2 Drawing Sheets

PIPELINE ANALOG-TO-DIGITAL CONVERTER CAPABLE OF SHARING COMPARATORS

BACKGROUND OF THE INVENTION

1. Field of the Invention

The present invention relates to a pipeline analog-to-digital converter (ADC), and more particularly, to a pipeline analog-to-digital converter that is capable of sharing comparators, and related methods.

2. Description of the Prior Art

Pipeline ADCs are common structures in high speed and high-resolution analog-to-digital converters. Please refer to FIG. 1. FIG. 1 schematically illustrates a 1-bit per stage pipeline analog-to-digital converter 100 according to the prior art. As FIG. 1 shows, an input end of the pipeline analog-to-digital converter 100 is coupled to a sample-hold-amplifier (SHA) 110, and the pipeline ADC 100 comprises a plurality of subsequent stages. FIG. 1 only illustrates two subsequent stages 120-1, 120-2 for simplicity. An input signal $V_{in}$ is sampled and amplified by the SHA 110 to generate a signal $V_{in1}$. Next, the signal $V_{in1}$ is fed into the subsequent stages 120-1. At this moment, a comparator 122-1 compares the signal $V_{in1}$ with the ground voltage level, so as to generate a digital output D(0). If the signal $V_{in1}$ is greater than the ground voltage level, the digital output D(0)=1. On the other hand, if the signal $V_{in1}$ is not greater than the ground voltage level, the digital output D(0)=0. Then, the signal $V_{in1}$ and the digital output D(0) are fed into a multiplying digital-to-analog converter (MDAC) 124-1 at the same time. The signal $V_{in}$ is amplified by an SHA 126 to generate a signal $V_{a1}$. The amplified signal $V_{a1}$ is then inputted to an adder 128-1. If the digital output D(0)=1, the output signal $V_{out1}$ of the adder 128-1 is $V_{a1}-V_{ref}$. On the other hand, if the digital output D(0)=0, the output signal $V_{out1}$ of the adder 128-1 is $V_{a1}+V_{ref}$. The output signal $V_{out1}$ is then fed to the subsequent stages 120-2, and a digital output D(1) is outputted after a similar operation of the subsequent stage 120-2 is performed. After a plurality of subsequent stages generate their respective digital outputs, the pipeline analog-to-digital converter 100 combines these digital signals outputted by the subsequent stages, and results in the combined digital signal.

As FIG. 1 shows, in the prior pipeline analog-to digital converter 100, the digital output of every subsequent stage corresponding to each clock cycle of the pipeline analog-to digital converter 100 generates a value. After the inner comparator of each subsequent stage performs a comparison operation, the inner comparator waits for a next input value in order to perform a next comparison operation in a next clock cycle of the pipeline analog-to-digital converter 100. In addition, the multiplying digital-to-analog converter (MDAC) determines the waiting period of the comparator. Because the operation of the MDAC requires a longer time than the operation of the comparator in each clock cycle of the pipeline analog-to digital converter 100, the comparator idles for a significant time. Therefore, if the comparator between two subsequent stages could be shared, the circuit area could be released in order to save power.

SUMMARY OF THE INVENTION

It is therefore one objective of the claimed invention to provide a pipeline analog-to-digital converter capable of sharing comparators, and related methods. The pipeline analog-to-digital converter utilizes the leisure time of the comparator's work period to share the comparator, in order to save electricity and the circuit area.

The present invention discloses a first embodiment of a pipeline analog-to-digital converter. A pipeline analog-to-digital converter includes a first conversion module; a second conversion module, at least a comparator, a first switch module, and a second switch module. The first switch module includes a first storage unit, where a first MDAC couples the first storage unit to the first switch module. The second switch module includes a second storage unit, and a second MDAC couples the second storage unit to the second switch module. The switch module is for coupling the input end of the first conversion module or the input end of the second conversion module to an input end of the comparator. A second switch module is for coupling an output end of the comparator to the first storage unit or the second storage unit. The first and the second switch modules switch in each clock cycle of the pipeline analog-to-digital converter in order to make the first and the second conversion modules share the same comparator.

The present invention discloses a second embodiment of a pipeline analog-to-digital converter. A pipeline analog-to-digital converter includes a first conversion module, a second conversion module, at least a comparator, a first switch module, and a second switch module. The first switch module includes a first storage unit and a first MDAC, and the second switch module includes a second storage unit and a second MDAC. The first switch module switches the first conversion module to the comparator, and the second conversion module to the comparator. A second switch module switches an output end of the comparator to the first storage unit, and the output end of the comparator to the second storage unit.

These and other objectives of the present invention will no doubt become obvious to those of ordinary skill in the art after reading the following detailed description of the preferred embodiment that is illustrated in the various figures and drawings.

DETAILED DESCRIPTION

Please note that in the following disclosure, a 1-bit per stage pipeline analog-to-digital converter is utilized as an example, not a limitation of the present invention. That is, every pipeline analog-to-digital converter capable of sharing comparators also obeys the spirit of the present invention.

Figure 2:
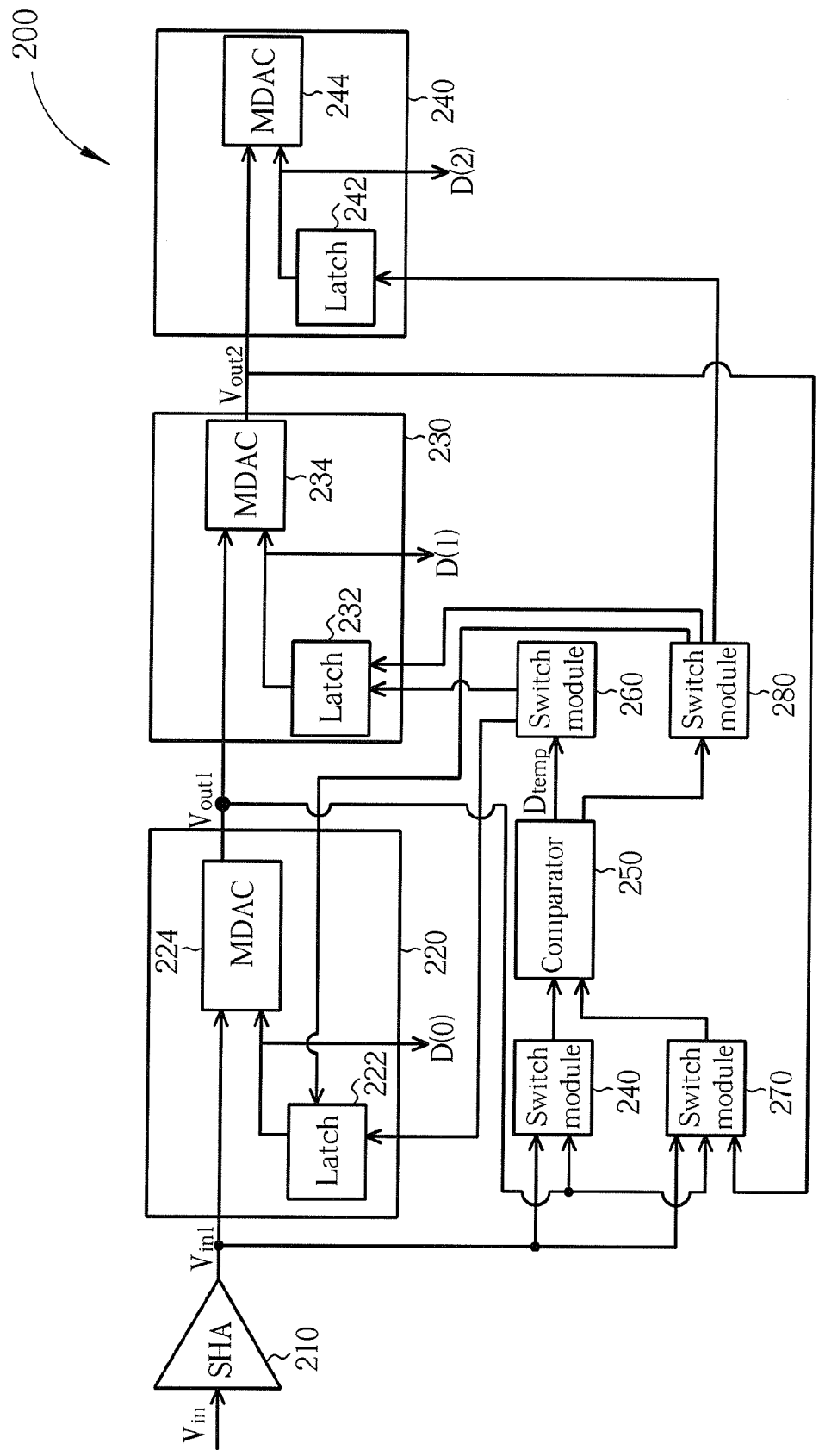
FIG. 2 is a functional block diagram of one embodiment of a pipeline analog-to-digital converter 200 according to the present invention.

Please refer to FIG. 2. FIG. 2 is a functional block diagram of one embodiment of a pipeline analog-to-digital converter 200 according to the present invention. As FIG. 2 shows, an input end of the pipeline analog-to-digital converter 200 is coupled to a sample-and-hold amplifier (SHA) 210. The pipeline ADC 200 comprises a plurality of subsequent stages. FIG. 2 only shows three subsequent stages 220, 230, and 240 for simplicity. The operation of the pipeline analog-to-digital converter 200 is performed according to a reference clock (not shown). Each subsequent stage outputs a digital signal D in every clock cycle of the pipeline analog-to-digital converter 200. In this embodiment, the digital signal D of each subsequent stage is a 1-bit signal. Please note that this does not limit the scope of the present invention.

Figure 1:
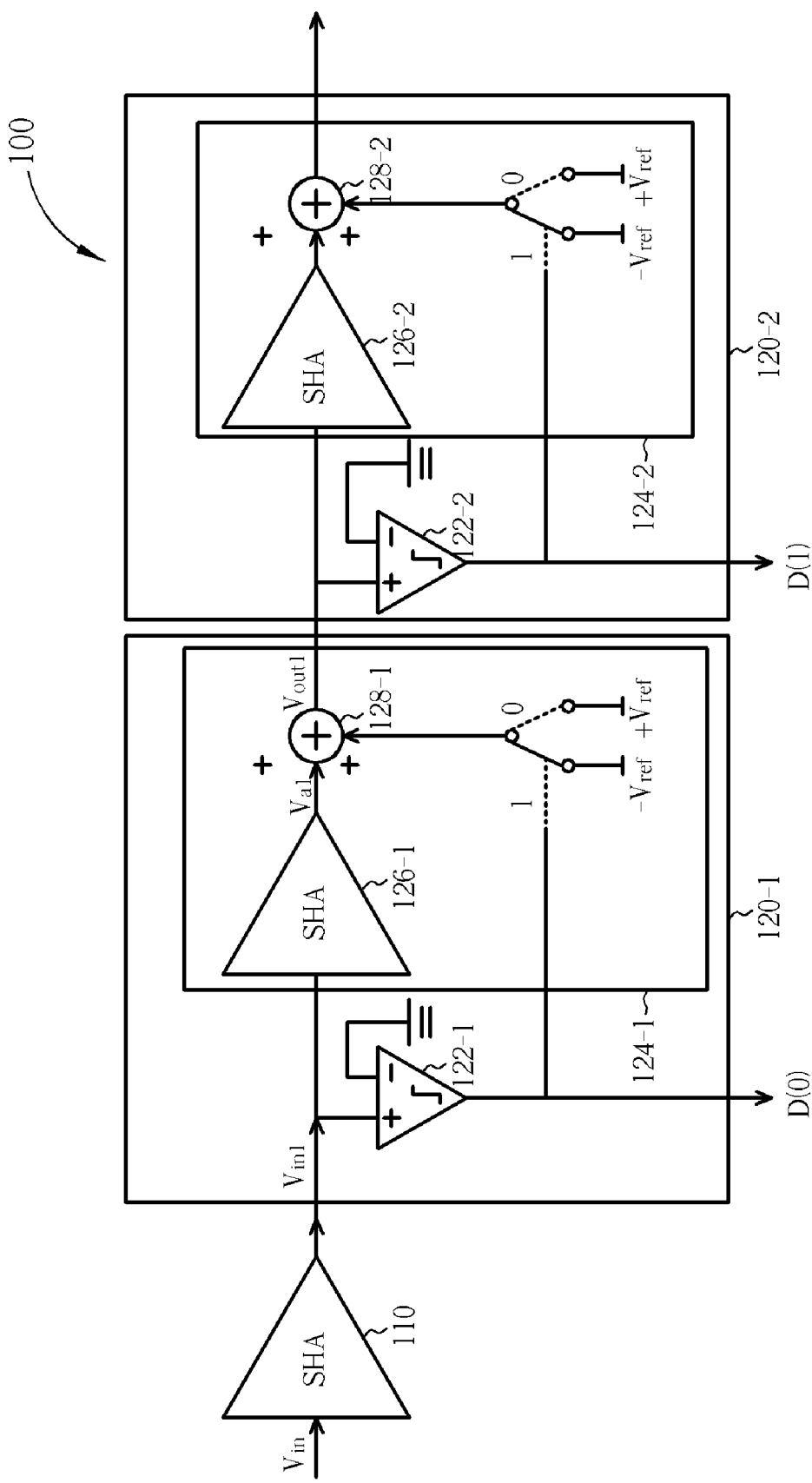
FIG. 1 schematically illustrates a 1-bit per stage pipeline analog-to-digital converter 100 according to the prior art.

In a stable state, an input signal $V_{in}$ is inputted into the pipeline analog-to-digital converter 200, sampled and amplified by the SHA 210 to generate a signal $V_{in1}$. The signal $V_{in1}$ is then fed to the subsequent stages 220 and a switch module 240 at the same time. The switch module 240 is switched according to the reference clock cycle. In a first period of a first clock cycle of the reference clock, the switch module 240 receives the input signal $V_{in1}$ and outputs the signal to the comparator 250. Please notice the structure of the comparator 250 is the same as the structure of the comparator 122-1 shown in FIG. 1. The comparator 250 compares the signal $V_{in1}$ with the ground voltage level. If the signal $V_{in1}$ is greater than the ground voltage level, the output value is determined to be a digital signal $D_{temp}=1$. In other words, if signal $V_{in1}$ is not greater than the ground voltage level, the output value is determined to be a digital signal $D_{temp}=0$. The comparator 250 feeds the digital signal $D_{temp}$ into a switch module 260. The switch module is similarly switched according to the reference clock. In the first period of the first clock cycle of the reference clock, the switch module outputs the signal $D_{temp}$ to a latch 222 to temporarily store the signal $D_{temp}$.

In the first period of the first clock cycle, the operation of the other subsequent stage 230 is illustrated as follows. Because the comparator 250 is utilized by the subsequent stage 220 according to the selections of the switch modules 240 and 260, the subsequent stage 230 does not have any comparator for utilizing in the first period of the first clock cycle. Therefore, an MDAC 234 in the subsequent stage 230 receives the output signal $V_{out1}$ of the subsequent stage 220 and the digital signal D(1) temporarily stored in the latch 232, for operating. The operations of the MDACs 234, 224 are similar to the MDACs 124-1, 124-2 in FIG. 1, and thus omitted here. The MDAC 234 outputs an output signal $V_{out2}$ after operation.

In the second period of the first clock cycle, the switch module 240 switches for coupling the input end of the comparator 250 to the output end of the subsequent stage 220 in order to receive the output signal $V_{out1}$ as an input to the comparator 250. The switch module 260 also couples the output end of the comparator 250 to the latch 232 of the subsequent stage 230. Therefore, in the second period of the first clock cycle, the comparator 260 is utilized by the subsequent stage 230. In other words, the subsequent stages 230 perform a comparison operation at this time to generate $D_{temp}$, and $D_{temp}$ is temporarily stored in the latch 232. At the same time, the MDAC 224 of the subsequent stage 220 performs a digital/analog conversion, thus, the MDAC 224 receives the signal $V_{in1}$ and the digital signal D(0) temporarily stored in the latch 222 in the first period of the first clock cycle and outputs an output signal $V_{out1}$.

The above-mentioned subsequent stages 220, 230 output a digital signal D in each clock period. Two subsequent stages 220, 230 utilize the comparator in two different periods respectively within the same clock cycle, and thus, the subsequent stages 220, 230 can share the same comparator 250. In other words, in the first period of a specific clock cycle of the pipeline analog-to-digital converter 200, the subsequent stage 220 performs a comparison operation, and the result of the comparison operation is temporarily stored to be fed into the MDAC 224 in a second period of the specific clock cycle, and a digital/analog conversion operation is then performed to output a signal $V_{out1}$. In the first period of the specific clock cycle, the subsequent stage 230 outputs the signal $V_{out2}$ after the MDAC 234 performs the digital/analog conversion operation. In the second period of the specific clock cycle, the subsequent stage 230 performs a comparison operation, and the result is temporarily stored in the latch 232, so the MDAC 234 can perform a digital/analog conversion on the result in a first period of the next clock cycle.

In another embodiment of the present invention, the switch modules 240 and 260 receive an additional reference clock for triggering to perform switching operations. The additional reference clock is synchronized to the reference clock, where the frequency of the additional reference clock is twice of the frequency of the reference clock. Please note that the relationship between the frequency of the additional reference clock and that of the reference clock is only utilized as an illustration, not a limitation of the present invention. In the actual application, the present invention could be utilized in all kinds of converters that are able to share the comparators and trigger the switch modules 240, 260 to perform switching operations.

Please note the above-mentioned components, such as the latch, and the switch module, can be exchanged with other equivalent components, if the modification does not influence the present invention. Moreover, the present invention can be utilized in n-bit per stage (n>=1) pipeline analog-to-digital converters, and more comparators can thereby be utilized between two subsequent stages for saving more circuit area. On the other hand, more than two stages (e.g. the subsequent stage 220 having a latch 222 and an MDAC 224, the subsequent stage 230 having a latch 232 and an MDAC 234, and the subsequent stage 240 having a latch 242 and an MDAC 244 in FIG. 2) can share one (or more than one) comparator (or comparators) by utilizing switch modules 270 and 280 according to the present invention to save circuit area.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pipeline analog-to-digital converter (pipeline ADC) comprising:
   a first conversion module;
   a second conversion module;
   at least a comparator;
   a first switch module, for coupling one input end of the first conversion module and the second conversion module to an input end of the comparator; and
   a second switch module, for coupling an output end of the comparator to one of the first and the second conversion modules;
   wherein the first and the second switch modules switch in each clock cycle of the pipeline analog-to-digital converter, the first and the second conversion modules share the comparator, and the input end of the second conversion module is coupled in series with an output end of the first conversion module.

2. The pipeline analog-to-digital converter of claim 1, wherein the first conversion module comprises:
   a first storage unit; and
   a first multiplying digital-to-analog converter (MDAC), coupled to the first storage unit.

3. The pipeline analog-to-digital converter of claim 2, wherein the second conversion module comprises:
   a second storage unit; and
   a second MDAC, coupled to the second storage unit.

4. The pipeline analog-to-digital converter of claim 3, wherein the second switch module couples the output end of the comparator to one of the first storage unit and the second storage unit.

5. The pipeline analog-to-digital converter of claim 3, wherein the first and the second MDACs share the same operational amplifier (OP amp).

6. The pipeline analog-to-digital converter of claim 3, wherein in a first period of the clock cycle, the first switch module couples the first conversion module to the comparator, and the second switch module couples the comparator to the first storage unit; and in a second period of the clock cycle, the first switch module couples the second conversation module to the comparator, and the second switch module couples the comparator to the second storage unit.

7. The pipeline analog-to-digital converter of claim 3, wherein the first and the second storage units are latches.

8. The pipeline analog-to-digital converter of claim 3, further comprising a third conversion module, the third conversion module comprising:
a third storage unit; and
a third MDAC, coupled to the third storage unit.

9. The pipeline analog-to-digital converter of claim 8, wherein the third storage unit is a latch.

10. The pipeline analog-to-digital converter of claim 8, further comprising a third switch module, for coupling the first conversion module, the second conversion module, and the third conversion module to the comparator.

11. The pipeline analog-to-digital converter of claim 8, further comprising a fourth switch module, for coupling the comparator to the first storage unit, the second storage unit, and the third storage unit.

12. A pipeline analog-to-digital converter (pipeline ADC) comprising:
a first conversion module, comprising:
a first storage unit; and
a first MDAC;
a second conversion module, comprising:
a second storage unit; and
a second MDAC;
at least a comparator;
a first switch module for switching an input end of the first conversion module to an input end of the comparator, and for switching an input end of the second conversion module to the input end of the comparator; and
a second switch module for switching an output end of the comparator to the first storage unit, and for switching the output end of the comparator to the second storage unit.

13. The pipeline analog-to-digital converter of claim 12, wherein the first and the second switch modules are switched in each clock cycle of the pipeline analog-to-digital converter, so the first and the second conversion modules share the comparator.

14. The pipeline analog-to-digital converter of claim 12, wherein the first and the second MDACs share the OP amp.

15. The pipeline analog-to-digital converter of claim 12, wherein in a first period of the clock cycle, the first switch module couples the input end of the first conversion module to the input end of the comparator, and the second switch module couples the output end of the comparator to the first storage unit; in a second period of the clock cycle, the first switch module couples the input end of the second conversion module to the input end of the comparator, and the second switch module couples the output end of the comparator to the second storage unit.

16. The pipeline analog-to-digital converter of claim 12, wherein the first and the second storage units are latches.

17. The pipeline analog-to-digital converter of claim 12, further comprising a third conversion module, the third conversion module comprising:
a third storage unit; and
a third MDAC.

18. The pipeline analog-to-digital converter of claim 17, wherein the third storage unit is a latch.

19. The pipeline analog-to-digital converter of claim 17, further comprising a third switch module, for switching the input end of the first conversion module to the input end of the comparator, the input end of the second conversion module to the input end of the comparator, and the input end of the third conversion module to the input end of the comparator.

20. The pipeline analog-to-digital converter of claim 17, further comprising a fourth switch module, wherein the fourth switch module switches the comparator to the first, the second, and the third storage units, for switching the output end of the comparator to the first storage unit, the output end of the comparator to the second storage unit, and the output end of the comparator to the third storage unit.

21. A pipeline analog-to-digital converter (pipeline ADC) comprising:
a first conversion module;
a second conversion module;
at least a comparator;
a first switch module, coupled to the first conversion module and the second conversion module, for receiving an input signal of the first conversion module and an input signal of the second conversion module and outputting either the input signal of the first conversion module or the input signal of the second conversion module to an input end of the comparator; and
a second switch module, coupled to the first conversion module and the second conversion module, for outputting an output signal generated from the comparator to one of the first and the second conversion modules;
wherein the first and the second switch modules switch in each clock cycle of the pipeline analog-to-digital converter, the first and the second conversion modules share the comparator.

* * * * *